(12) United States Patent
Müller et al.

(10) Patent No.: US 6,852,598 B2
(45) Date of Patent: Feb. 8, 2005

(54) METHOD FOR THE FABRICATION OF A DMOS TRANSISTOR

(75) Inventors: Karlheinz Müller, Velden (DE); Klaus Röschlau, Grafing (DE); Cajetan Wagner, Dresden (DE)

(73) Assignee: Infineon Technologies AG, Munich (DE)

( * ) Notice: Subject to any disclaimer, the term of this patent is extended or adjusted under 35 U.S.C. 154(b) by 48 days.

(21) Appl. No.: 10/424,019

(22) Filed: Apr. 25, 2003

(65) Prior Publication Data

US 2003/0190778 A1 Oct. 9, 2003

Related U.S. Application Data

(63) Continuation of application No. PCT/EP01/12035, filed on Oct. 17, 2001.

(51) Int. Cl.⁷ .............................................. H01L 21/336
(52) U.S. Cl. ....................................... 438/270; 257/335
(58) Field of Search ........................... 438/270; 257/335

(56) References Cited

U.S. PATENT DOCUMENTS

| | | | |
|---|---|---|---|
| 5,382,536 A | * | 1/1995 | Malhi et al. .................. 437/41 |
| 5,430,316 A | * | 7/1995 | Contiero et al. ............. 257/335 |
| 5,739,061 A | | 4/1998 | Kitamura et al. |
| 5,913,114 A | | 6/1999 | Lee et al. |
| 6,268,626 B1 | * | 7/2001 | Jeon ............................ 257/335 |
| 6,492,678 B1 | * | 12/2002 | Hebert ........................ 257/331 |

* cited by examiner

*Primary Examiner*—David Nelms
*Assistant Examiner*—Quoc Hoang
(74) *Attorney, Agent, or Firm*—Laurence A. Greenberg; Werner H. Stemer; Gregory L. Mayback

(57) ABSTRACT

A method for the fabrication of a DMOS transistor structure provides the advantage that, through the use of a protective layer, the DMOS transistor structure, which has already been substantially completed, is protected from the adverse effects of further process steps. The DMOS gate electrode is not, as is customary in the prior art, patterned using a single lithography step, but, rather, the patterning of the DMOS gate electrode is split between two lithography steps. In a first lithography step, substantially only the source region of the DMOS transistor structure is opened. Therefore, the electrode layer that is still present can be used as a mask for the subsequent fabrication of the body region.

20 Claims, 4 Drawing Sheets

METHOD FOR THE FABRICATION OF A DMOS TRANSISTOR

CROSS-REFERENCE TO RELATED APPLICATION

This application is a continuation of copending International Application No. PCT/EP01/12035, filed Oct. 17, 2001, which designated the United States and was not published in English.

BACKGROUND OF THE INVENTION

Field of the Invention

The present invention relates to a method for the fabrication of a DMOS transistor, in particular, to a method for the fabrication of a DMOS transistor that is integrated with a CMOS logic in a semiconductor component.

In many applications of modern electronic products, the problem arises that, in addition to the pure processing of information, the electronic product also has to act in some form on its environment. Applications of this type include a very wide range of products. One example that may be mentioned is the control system of an airbag, which, on one hand, evaluates the measurement signals from an acceleration sensor and, on the other hand, in the event of an accident, triggers the airbag. A further example is an intelligent charger for recharging batteries.

For cost reasons, it is advantageous if all these different functions can be integrated in a single semiconductor product. However, high demands are imposed on the fabrication process used when fabricating "smart-power" products of this type. For example, various types of components, such as CMOS transistors, DMOS power transistors, and bipolar transistors, have to be integrated with a high packing density on a chip. The integration should take place such that the individual types of components as far as possible have ideal component parameters. At the same time, however, the fabrication process should involve the smallest possible number of process steps, in particular, a small number of mask levels.

The integration of one or more DMOS power transistors and a CMOS logic usually involves the use of two different gate oxide/gate poly complexes. As such, the device parameters of the DMOS transistor and the device parameters of the CMOS transistors can be set substantially independently of one another according to the particular requirements. The typical process sequence involved in the integration of two gate oxide/gate poly complexes has been sketched based upon diagrammatic cross-sectional illustrations in the region of the DMOS transistor in FIGS. 1A to 1F.

To fabricate the DMOS transistor, a semiconductor substrate 1 is provided, on which the insulation 2 between the individual transistors and the gate oxide 3 has already been produced. Then, a polysilicon layer 4 is deposited, and an insulation layer 5 is deposited on the polysilicon layer 4. Then, the polysilicon layer 4 and the insulation layer 5 are patterned by photolithography to form a DMOS gate stack (FIG. 1A).

Then, a photoresist 6 is applied, which is patterned using a second photolithography plane. The patterned photoresist 6 forms a mask, with the aid of which the dopants for body 8 and source 9 of the DMOS transistor are implanted in the source region of the DMOS transistor (FIG. 1B).

As a result of a heat treatment, the implanted dopants diffuse out and form body 8 and source 9 of the DMOS transistor (FIG. 1C). The amorphizing source implantation often causes crystal defects. With the formation of body 8 and source 9 of the DMOS transistor, the fabrication of the DMOS transistor is substantially completed, apart from the connection implantations. However, further process steps that are used for the fabrication of the CMOS transistors (not shown) and that, of course, also affect the substantially complete DMOS transistor, still follow.

The active regions are, then, etched clear. In the area of the DMOS transistor, this leads to the source of the DMOS transistor being etched clear. This etching clear of the active regions serves, in the area of the CMOS transistors, to prepare the fabrication of the gate oxide for the CMOS transistors. This etching step leads to undercut etching 10 of the DMOS gate oxide beneath the DMOS gate stack (FIG. 1D).

Then, the gate oxide for the CMOS transistors is fabricated, and during this CMOS gate oxidation, the exposed DMOS gate poly flank is oxidized in the area of the DMOS transistor, and the gate oxide thickness of the DMOS transistor increases in the area of the undercut etching 10, at the transition to the source 9 ("bird's beak"). This has an uncontrollable influence on the threshold voltage, greatly increasing its scatter. There follows the deposition of a further polysilicon layer 11, which, in the area of the CMOS transistors, serves for the fabrication of the CMOS gate stacks (FIG. 1E).

During the subsequent patterning of the CMOS gate electrode, what are referred to as spacers 12 remain on the flanks of the DMOS gate electrode (FIG. 1F) and cannot be completely removed on account of the overhang of polysilicon. These highly doped polysilicon spacers 12 bring with them a range of adverse effects with regard to the scatter of the threshold voltage of the DMOS transistor and the yield that can be achieved.

It can be seen that, in the prior art, the fabrication of the CMOS transistors leads to a range of adverse effects on the DMOS transistors that have already been produced, and this has a considerably adverse effect on the device parameters of the DMOS transistor or may even lead to the entire integrated component failing.

SUMMARY OF THE INVENTION

It is accordingly an object of the invention to provide a method for the fabrication of a DMOS transistor that overcomes the hereinafore-mentioned disadvantages of the heretofore-known devices and methods of this general type and that reduces or completely prevents the abovementioned problems.

With the foregoing and other objects in view, there is provided, in accordance with the invention, a method for the fabrication of a DMOS transistor structure that includes the following steps:

a) providing a semiconductor substrate with a gate oxide;
b) applying a conductive layer to the gate oxide;
c) patterning the conductive layer, with substantially only those parts of the conductive layer that are disposed above the source region being removed;
d) producing the body region and the source region;
e) applying at least one protective layer;
f) patterning the protective layer and the conductive layer so that the gate electrode is produced: and
g) removing the protective layer at least above the source region.

The invention has the advantage that, through the use of a protective layer, the DMOS transistor structure, which has already been substantially completed, is protected from the adverse effects of further process steps. According to the invention, the DMOS gate electrode is not, as is customary in the prior art, patterned using a single lithography step, but, rather, the patterning of the DMOS gate electrode is split between two lithography steps. In a first lithography step, substantially only the source region of the DMOS transistor structure is opened. Therefore, the electrode layer that is still present can be used as a mask for the subsequent fabrication of the body region.

After the process steps for fabrication of the body and source regions that are important to the DMOS transistor structure have been carried out, a protective layer is applied and, during the final structuring of the DMOS gate electrode by a further lithography step, is retained on the source region, protecting the latter during the further processing, for example, for the fabrication of CMOS transistors or bipolar transistors. Despite the fact that the DMOS gate patterning is split into two photolithography levels, the method according to the invention can be carried out without an additional lithography step because the mask for the body implantation that is required in the prior art is dispensed with.

The conductive layer used is, preferably, a polysilicon layer. Furthermore, it is preferable if the protective layer includes a silicon oxide layer, a silicon nitride layer, a silicon oxide layer. In such a case, it is particularly preferable if the silicon oxide layer used is a TEOS layer.

In accordance with another mode of the invention, the DMOS transistor is integrated with CMOS transistors in a semiconductor component. In such a case, the protective layer serves, in particular, to protect the DMOS transistor structure, which is already substantially complete, from the adverse effects of further process steps used for the fabrication of the gate oxide/gate electrode for the CMOS transistors.

In accordance with a further mode of the invention, it is particularly preferable if the gate oxide for the CMOS transistors is produced between step f) and step g). Furthermore, in accordance with an added mode of the invention, it is preferable if the gate electrodes of the CMOS transistors are produced between step f) and step g). In accordance with an additional mode of the invention, etching is carried out to remove the residues of the gate electrodes for the CMOS transistors above the source region.

With the objects of the invention in view, there is also provided a method for the fabrication of a DMOS transistor structure, including the steps of providing a semiconductor substrate with a gate oxide, applying a conductive layer to the gate oxide, patterning the conductive layer to remove substantially only parts of the conductive layer that are disposed above a source region to be provided subsequently, producing a body region and the source region, applying at least one protective layer, patterning the protective layer and the conductive layer to produce a gate electrode, and removing the protective layer at least above the source region.

Other features that are considered as characteristic for the invention are set forth in the appended claims.

Although the invention is illustrated and described herein as embodied in a method for the fabrication of a DMOS transistor, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

DESCRIPTION OF THE PREFERRED EMBODIMENTS

Figure 1A:
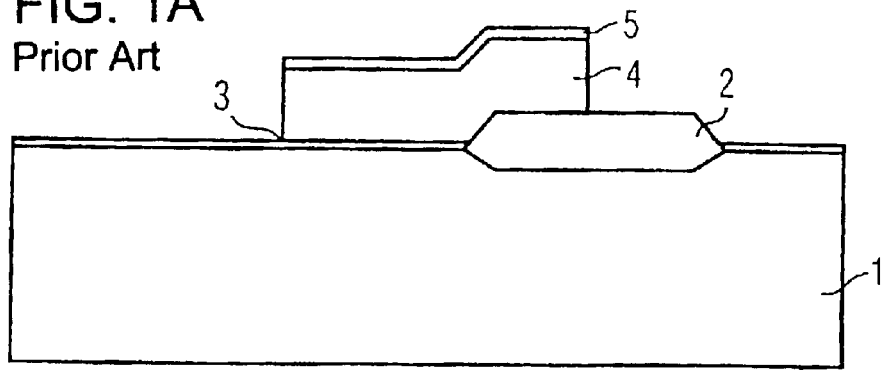
FIGS. 1A to 1F are fragmentary, diagrammatic, cross-sectional views illustrating a series of process steps for producing a transistor configuration according to the prior art.
Figure 1B:
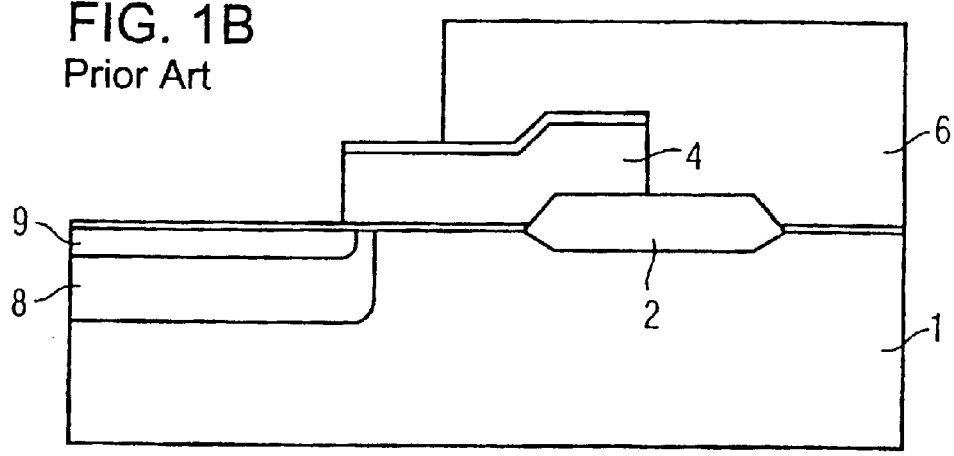
Figure 1C:
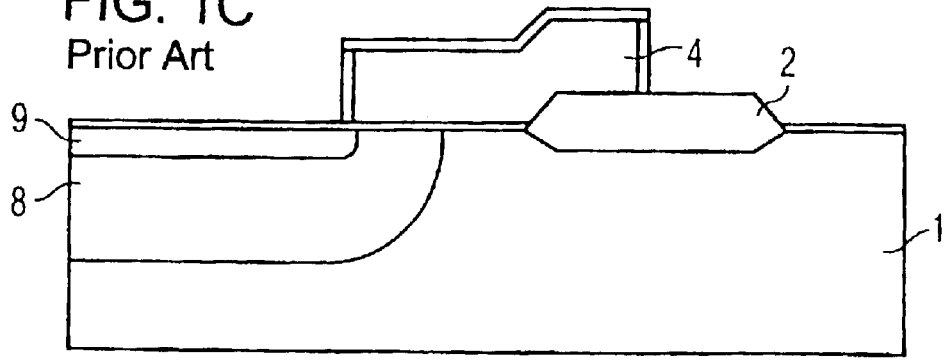
Figure 1D:
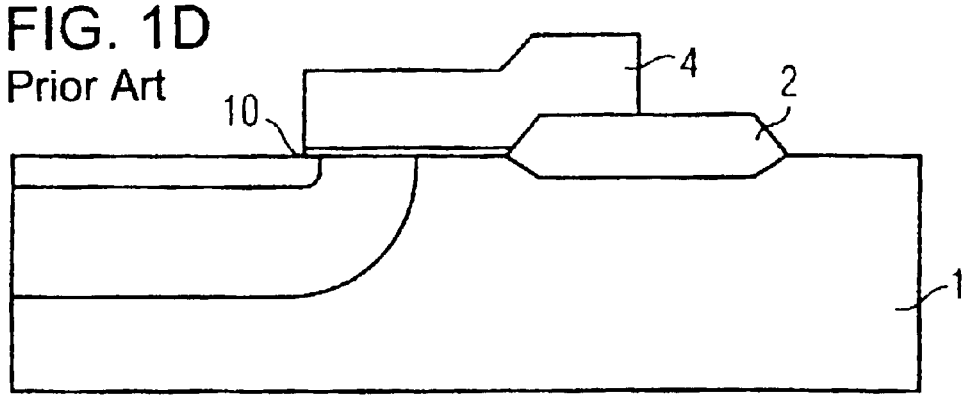
Figure 1E:
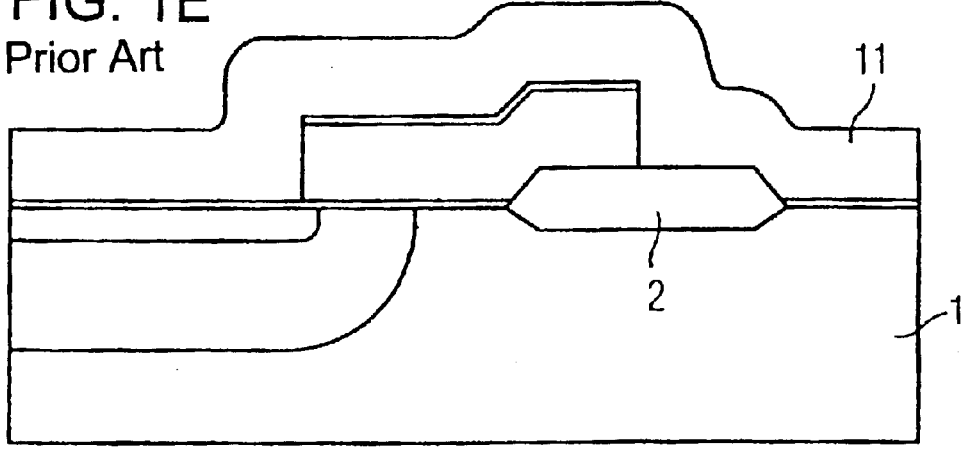
Figure 1F:
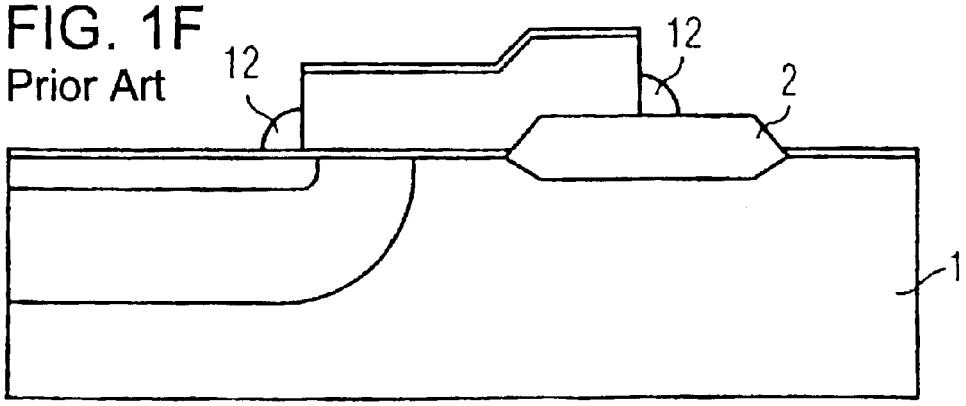
Figure 2A:
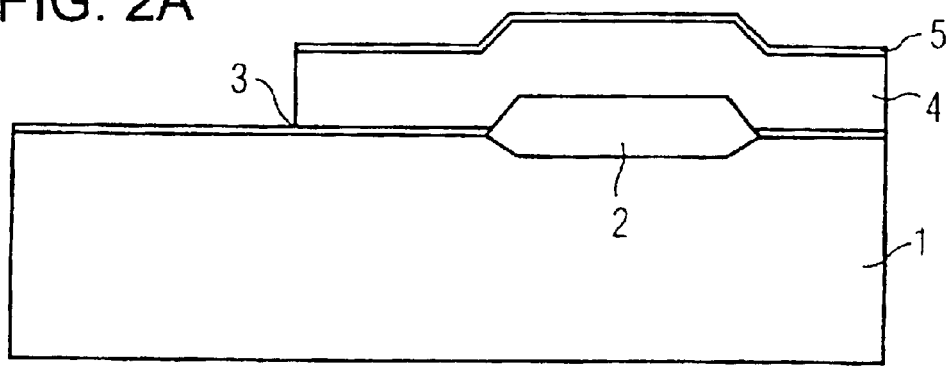
FIGS. 2A to 2F are fragmentary, diagrammatic, cross-sectional views illustrating a series of process steps for producing a transistor configuration according to the invention.

Referring now to the figures of the drawings in detail and first, particularly to FIGS. 2a to 2f thereof, there is shown a diagrammatically depiction of steps of a method according to the invention for the fabrication of a DMOS transistor structure. To fabricate the DMOS transistor structure, a semiconductor substrate 1 is provided, on which the insulation 2 between the individual transistors and the gate oxide 3 have already been produced. Furthermore, all the well regions, buried regions and deep diffusion required for the complete fabrication of a DMOS transistor and of CMOS transistors have already been produced. Then, a conductive layer, preferably, a polysilicon layer 4 is deposited, and an insulation layer 5 is deposited on the polysilicon layer 4. Next, the polysilicon layer 4 and the insulation layer 5 are patterned by photolithography so that the polysilicon layer 4 is opened up substantially only in the source region (FIG. 2A). All the other regions, in particular, the regions in which CMOS transistors are to be produced subsequently, remain covered by the polysilicon layer 4.

Figure 2B:
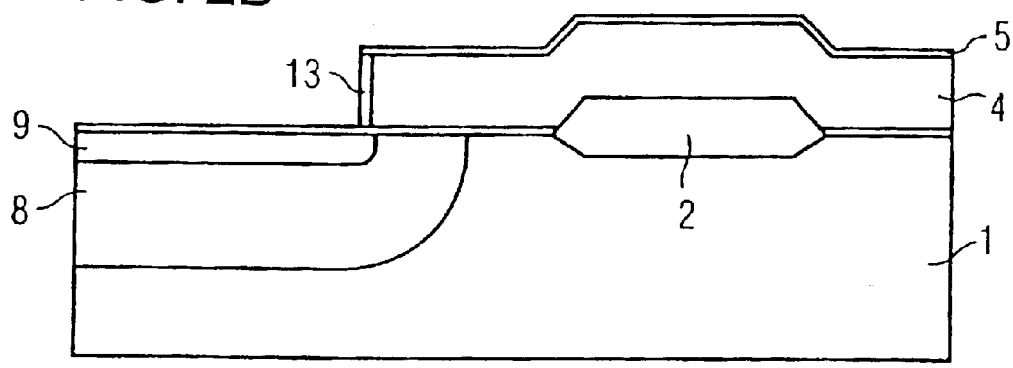

Then, dopant implantation for fabrication of the body region and of the source region is carried out. The implantations of body 8 and source 9 are masked by the patterned polysilicon layer 4. In the process, first of all, the dopant for the body region is implanted and is driven into the semiconductor substrate 1 by a heat treatment. Then, the dopant for the source region is implanted and is driven into the semiconductor substrate 1 by a second heat treatment. This has the advantage over conventional methods in that the source implantation can be carried out without additional outlay after the body diffusion. This reduces the density of crystal defects and facilitates optimization of the source doping. Preferably, oxidation 13 to seal the open polysilicon flank takes place at the start of the first heat treatment (furnace step) (FIG. 2B).

Figure 2C:
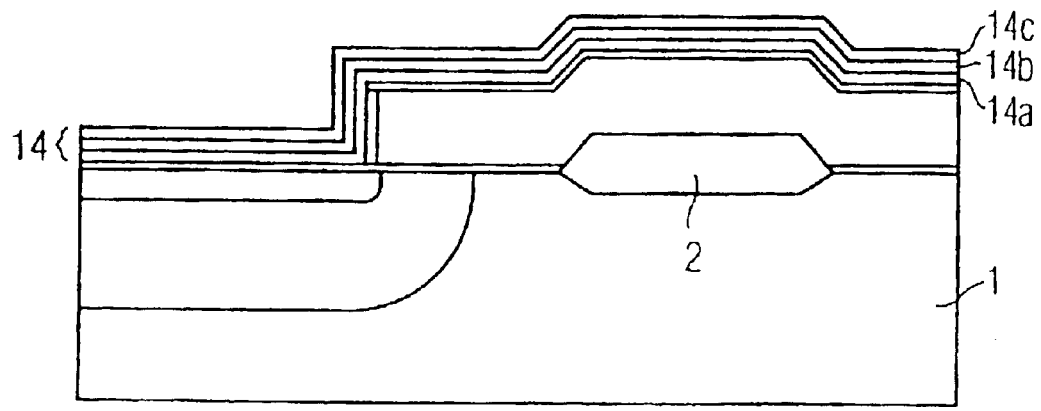

Then, the source region and the remaining polysilicon regions are covered by a protective layer 14 (FIG. 2C). In the present example, the protective layer 14 includes three individual layers, namely, a silicon oxide layer 14a, a silicon nitride layer 14b, and a further silicon oxide layer 14c. All three layers are, preferably, produced with the aid of CVD processes. It is particularly preferable if the two silicon oxide layers 14a, 14c are produced by a TEOS process.

Then, the DMOS gate stack is completely patterned using a second photolithography level. In the process, the conductive layer 4 is also removed in the area of all other components, in particular, in the area of the CMOS transistors (not shown) that are yet to be produced. The protective layer 14 can be used as a hard mask for the etching of the conductive layer 4.

Next, the active regions are etched clear. During this etching clear of the silicon surface prior to the gate oxidation for the CMOS transistors, the upper TEOS layer is removed. However, undercut etching of the DMOS gate electrodes, as occurs at this point in the process sequence of the prior art, is prevented by the silicon nitride layer. Accordingly, as the process proceeds, the formation of a "bird's beak" at the edge of the gate electrode is also effectively prevented. This is a further significant advantage of the method according to the invention over the methods of the prior art.

Figure 2D:
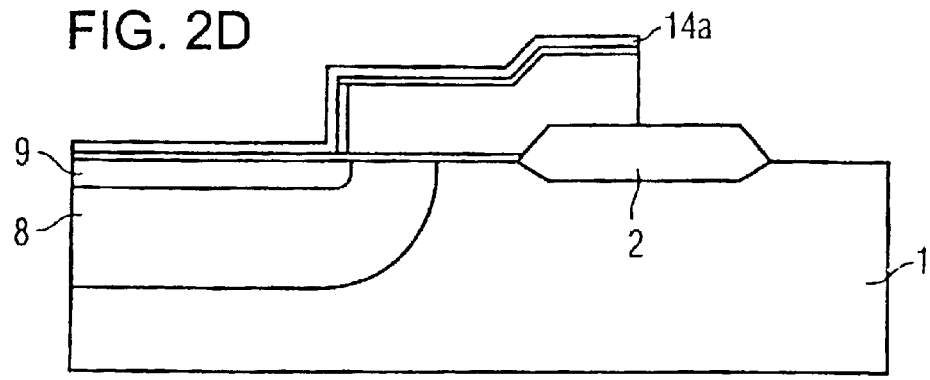
Figure 2E:
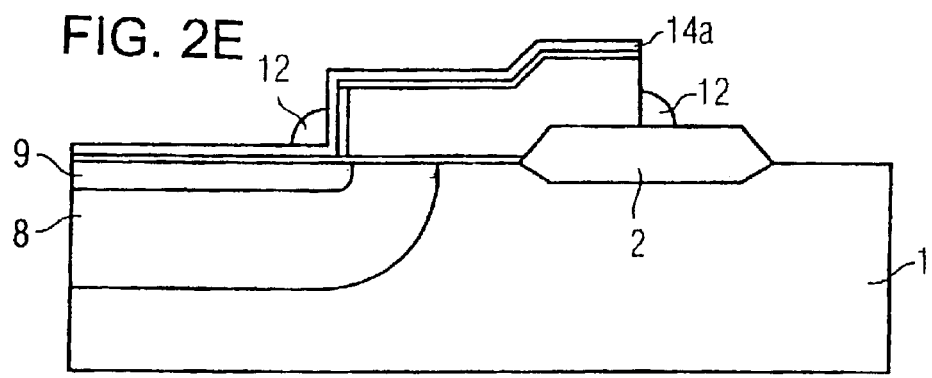
Figure 2F:
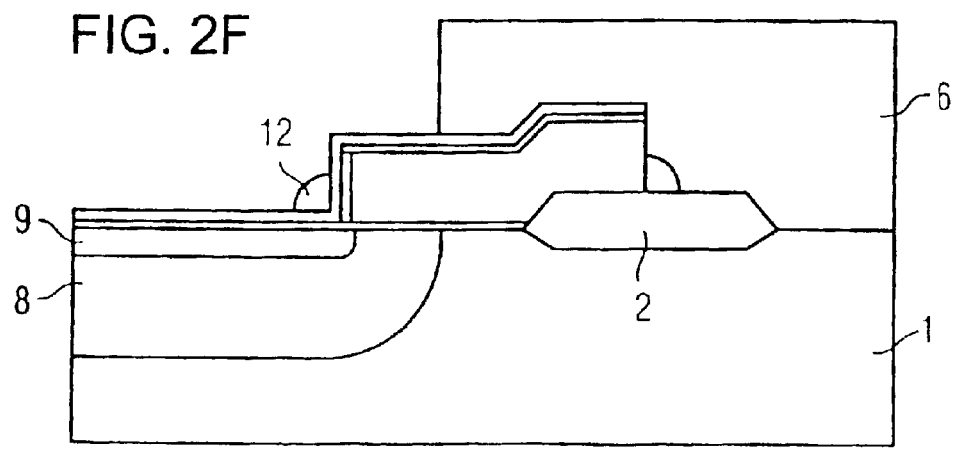

Then, the nitride layer is removed, for example, by wet etching. The resulting situation is shown in FIG. 2D. Prior to the formation of the gate oxide for the CMOS transistors and the deposition of a further conductive layer, in particular, of a further polysilicon layer, therefore, the DMOS source region is still covered by the TEOS layer 14a. This results in the advantage that further partial oxidation and, therefore, the formation of a "bird's beak" beneath the DMOS gate electrode in the source region is substantially avoided (FIG. 2E).

During the patterning of the conductive layer for the purpose of forming the gate electrodes for the CMOS transistors, residues of the conductive layer generally remain on the source region next to the DMOS gate electrode. These polysilicon residues 12 in the source region are now sufficiently well separated from the source region and the DMOS gate electrode by the residual protective layer 14 (TEOS layer 14a) and, above all, are no longer located beneath an overhanging area of the DMOS gate electrode.

These polysilicon residues 12 may optionally also be removed without difficulty by an additional lithography step. Then, the connections for the DMOS transistor are produced. For such a purpose, as is generally customary, a non-illustrated spacer is produced above the source 9 and connection implantation is carried out. During the production of the spacer, the silicon oxide layer 14a is removed above the source 9 so that contact can be made between a non-illustrated conductive layer and the source 9 in further process steps.

We claim:

1. A method for fabricating a DMOS transistor structure, which comprises:
    a) providing a semiconductor substrate with a gate oxide;
    b) applying a conductive layer to the gate oxide;
    c) patterning the conductive layer, with substantially only parts of the conductive layer disposed above a subsequent source region being removed;
    d) producing a body region and the source region;
    e) applying at least one protective layer to the source region and the conductive layer;
    f) patterning the protective layer and the conductive layer to produce a gate electrode; and
    g) removing the protective layer at least above the source region.

2. The method according to claim 1, which further comprises providing the conductive layer as a polysilicon layer.

3. The method according to claim 1, which further comprises providing the protective layer with a silicon oxide layer, a silicon nitride layer, and a silicon oxide layer.

4. The method according to claim 3, which further comprises providing the silicon oxide layer as a TEOS layer.

5. The method according to claim 1, which further comprises providing the protective layer as a three-part layer including a silicon oxide layer, a silicon nitride layer, and a silicon oxide layer.

6. The method according to claim 5, which further comprises providing the silicon oxide layer as a TEOS layer.

7. The method according to claim 1, which further comprises integrating the DMOS transistor with CMOS transistors in a semiconductor component.

8. The method according to claim 7, which further comprises producing gate oxide for the CMOS transistors between step f) and step g).

9. The method according to claim 7, which further comprises producing gate electrodes of the CMOS transistors between step f) and step g).

10. The method according to claim 9, which further comprises carrying out etching to remove residues of the gate electrodes for the CMOS transistors above the source region.

11. A method for the fabrication of a DMOS transistor structure, comprising the following steps:
    a) providing a semiconductor substrate with a gate oxide;
    b) applying a conductive layer to the gate oxide;
    c) patterning the conductive layer to remove substantially only parts of the conductive layer that are disposed above a source region to be provided subsequently;
    d) producing a body region and the source region;
    e) applying at least one protective layer to the source region and the conductive layer;
    f) patterning the protective layer and the conductive layer to produce a gate electrode; and
    g) removing the protective layer at least above the source region.

12. The method according to claim 11, which further comprises providing the conductive layer as a polysilicon layer.

13. The method according to claim 11, which further comprises providing the protective layer with a silicon oxide layer, a silicon nitride layer, and a silicon oxide layer.

14. The method according to claim 13, which further comprises providing the silicon oxide layer as a TEOS layer.

15. The method according to claim 11, which further comprises providing the protective layer as a three-part layer including a silicon oxide layer, a silicon nitride layer, and a silicon oxide layer.

16. The method according to claim 15, which further comprises providing the silicon oxide layer as a TEOS layer.

17. The method according to claim 11, which further comprises integrating the DMOS transistor with CMOS transistors in a semiconductor component.

18. The method according to claim 17, which further comprises producing gate oxide for the CMOS transistors between step f) and step g).

19. The method according to claim 17, which further comprises producing gate electrodes of the CMOS transistors between step f) and step g).

20. The method according to claim 19, which further comprises carrying out etching to remove residues of the gate electrodes for the CMOS transistors above the source region.

\* \* \* \* \*

UNITED STATES PATENT AND TRADEMARK OFFICE
CERTIFICATE OF CORRECTION

PATENT NO. : 6,852,598 B2
DATED : February 8, 2005
INVENTOR(S) : Karlheinz Müller et al.

It is certified that error appears in the above-identified patent and that said Letters Patent is hereby corrected as shown below:

<u>Title page,</u>
Item [30], Foreign Application Priority Data, should read as follows:
-- Oct. 27, 2000      (DE)      …….. 100 53 428 --

Signed and Sealed this

Twenty-sixth Day of April, 2005

JON W. DUDAS
*Director of the United States Patent and Trademark Office*